(12) United States Patent
Patel et al.

(10) Patent No.: US 12,237,856 B2
(45) Date of Patent: Feb. 25, 2025

(54) Q-BAND BLOCK DOWN CONVERTER

(71) Applicant: Hughes Network Systems, LLC, Germantown, MD (US)

(72) Inventors: Kumud Patel, Clarksburg, MD (US); Minheng Shan, Rockville, MD (US); Guojun Chen, Damascus, MD (US)

(73) Assignee: Hughes Network Systems, LLC, Germantown, MD (US)

( * ) Notice: Subject to any disclaimer, the term of this patent is extended or adjusted under 35 U.S.C. 154(b) by 0 days.

(21) Appl. No.: 18/439,891

(22) Filed: Feb. 13, 2024

(65) Prior Publication Data

US 2024/0348275 A1 Oct. 17, 2024

Related U.S. Application Data

(63) Continuation of application No. 17/940,750, filed on Sep. 8, 2022, now Pat. No. 11,909,429.

(Continued)

(51) Int. Cl.
*H04B 1/10* (2006.01)
*H03L 7/099* (2006.01)
*H04B 1/40* (2015.01)

(52) U.S. Cl.
CPC ......... *H04B 1/1027* (2013.01); *H03L 7/0991* (2013.01); *H04B 1/40* (2013.01)

(58) Field of Classification Search
CPC ........ H04B 1/1027; H04B 1/40; H03L 7/0991
See application file for complete search history.

(56) References Cited

U.S. PATENT DOCUMENTS 4,446,566 A * 5/1984 Fuller ...................... H01P 9/00
324/76.35
5,896,421 A 4/1999 Zamat et al.
(Continued)

FOREIGN PATENT DOCUMENTS

EP 0485183 5/1992
EP 0485183 A2 * 5/1992
(Continued)

OTHER PUBLICATIONS

Dow et al., "Monolithic receivers with integrated temperature compensation function," Presented at the Proceedings of the Gallium Arsenide Integrated Circuit Symposium Technical Digest, New York, NY, USA, Oct. 20-23, 1991, 267-270.

(Continued)

*Primary Examiner* — Adam D Houston
(74) *Attorney, Agent, or Firm* — Fish & Richardson P.C.

(57) ABSTRACT

In some implementations, a radiofrequency down converter comprises an input port to receive a radiofrequency input signal, and the down converter includes a first bandpass filter configured to filter the input signal. The down converter includes a mixer stage coupled to the bandpass filter, the mixer stage being configured to generate a mixer output signal by processing the filtered input signal using a gain adjustment device, one or more amplifiers, and a mixer. The down converter includes a signal adjustment stage coupled to receive the mixer output signal, the signal adjustment stage comprising: a temperature compensation device configured to compensate for changes in signal gain due to changes in temperature; a second bandpass filter; a gain adjustment device; one or more amplifiers; and a low pass filter. The down converter comprises an output port coupled to output an adjusted mixer output signal from the signal adjustment stage.

20 Claims, 5 Drawing Sheets

Related U.S. Application Data

(60) Provisional application No. 63/242,438, filed on Sep. 9, 2021.

(56) References Cited

U.S. PATENT DOCUMENTS

| | | | |
|---|---|---|---|
| 5,983,085 A | | 11/1999 | Zamat et al. |
| 6,434,374 B1 | * | 8/2002 | Muterspaugh ........ H03G 3/3052 |
| | | | 455/131 |
| 6,535,087 B1 | | 3/2003 | Fitzpatrick et al. |
| 6,904,273 B2 | | 6/2005 | Steber et al. |
| 6,941,122 B2 | | 9/2005 | Shim |
| 7,030,795 B1 | | 4/2006 | Saunders et al. |
| 8,139,685 B2 | | 3/2012 | Simic et al. |
| 8,433,255 B2 | | 4/2013 | Harnishfeger |
| 9,810,788 B2 | | 11/2017 | Raghupathy et al. |
| 10,205,512 B2 | | 2/2019 | Patel et al. |
| 11,909,429 B2 | | 2/2024 | Patel et al. |
| 2002/0175776 A1 | * | 11/2002 | Pleasant ............ H04B 10/25752 |
| | | | 333/17.1 |
| 2004/0048588 A1 | * | 3/2004 | Ammar .............. H04B 7/18528 |
| | | | 455/134 |
| 2005/0124307 A1 | * | 6/2005 | Ammar ................ H04B 1/38 |
| | | | 455/259 |
| 2016/0204809 A1 | * | 7/2016 | Pratt .................. H04B 1/0475 |
| | | | 375/219 |
| 2023/0080916 A1 | * | 3/2023 | Patel .................. H03G 3/3036 |
| | | | 455/73 |
| 2023/0198492 A1 | * | 6/2023 | Lee ..................... H03H 7/38 |
| | | | 455/78 |
| 2023/0268668 A1 | * | 8/2023 | Pefkianakis ........... H01Q 21/24 |
| | | | 343/700 R |
| 2023/0291464 A1 | * | 9/2023 | Delisio, Jr. ........ H04B 7/18513 |

FOREIGN PATENT DOCUMENTS

| | | | | |
|---|---|---|---|---|
| GB | 2342238 | | 4/2000 | |
| GB | 2342238 A | * | 4/2000 | ............. H03D 7/161 |
| WO | WO-03028257 A1 | * | 4/2003 | ............... H04B 1/38 |
| WO | WO 20030028257 | | 4/2003 | |
| WO | WO-2023039095 A1 | * | 3/2023 | ............ H03G 3/3036 |

OTHER PUBLICATIONS everythingrf.com [online], "What is a Gain Equalizer?," Mar. 20, 2018, retrieved on Feb. 24, 2023, retrieved from URL<https://www.everythingrf.com/community/what-is-a-gain-equalizer>, 7 pages.

Gomez et al., "Process and Temperature Compensation for RF Low-Noise Amplifiers and Mixers," IEEE Transactions on Circuits and Systems, Dec. 2009, 57(6):1204-1211.

International Preliminary Report on Patentability and Written Opinion in International Appln. No. PCT/US2022/042949, mailed on Mar. 21, 2024, 14 pages.

International Search Report and Written Opinion in International Appln. No. PCT/US2022/042948, mailed on Feb. 13, 2023, 22 pages.

Invitation to Pay Additional Fees in International Appln. No. PCT/US2022/042948, mailed on Dec. 23, 2022, 17 pages.

Jeong et al., "Development of Ku-band receiver/ downconverter for satellite transponders," Presented at the Proceedings of the 2002 IEEE MTT-S International Microwave Symposium Digest, Piscataway, NJ, USA, Jun. 2-7, 2002, 2:1257-1260.

microwaves101.com [online], "Gain Equalizers, " Feb. 8, 2015, retrieved on Feb. 24, 2023, retrieved from URL<https://www.microwaves101.com/encyclopedias/gain-equalizers>, 3 pages.

Piao et al., "RF Design of the Temperature Compensation for the Quiescent Working Point of the Amplifier," Advances in Engineering Research, Mar. 2018, 137:478-481.

rfmwc.com [online], "RF Gain Equalizer:—About, Types, Application, Design, " upon information and belief, available no later than Sep. 9, 2021, retrieved on Feb. 24, 2023, retrieved from URL<https://rfmwc.com/product-details/rf-gain-equalizers>, 6 pages.

techbriefs.com [online], "Improved Temperature-Compensating Microwave Attenuators," Aug. 1, 2000, retrieved on Feb. 24, 2023, retrieved from URL<https://www.techbriefs.com/component/content/article/tb/pub/briefs/electronics-and-computers/29503>, 4 pages.

wikipedia.com [online], "Isolator (microwave)," May 25, 2009, retrieved on Feb. 24, 2023, retrieved from URL<https://en.wikipedia.org/wiki/Isolator_(microwave)>, 4 pages.

Wu et al., "Real-time temperature compensation for tunable cavity-based BPFs and BSFs," IET Circuits, Devices & Systems, 2018, 12(6):785-791.

* cited by examiner

Q-BAND BLOCK DOWN CONVERTER

CROSS-REFERENCE TO RELATED APPLICATIONS

This application is a continuation of U.S. application Ser. No. 17/940,750, filed Sep. 8, 2022, which claims the benefit of priority to U.S. Provisional Patent Application No. 63/242,438, filed on Sep. 9, 2021, both of which are incorporated by reference herein.

FIELD

This specification generally describes technology related to providing improved down converters for communication systems, such as for gateways of satellite networks.

BACKGROUND

In a satellite communication system, a gateway is used as a ground station to connect a terrestrial network, such as the Internet, and satellites orbiting Earth. For example, the gateway can transmit data from user terminals or other devices to the orbiting satellites. Further, the gateway can receive data from the orbiting satellites and relay the data to the terrestrial network. The gateway uses antennas and other equipment for converting, transmitting, and receiving signals. For example, the gateway typically includes a down converter to convert high-frequency radiofrequency (RF) signals received by an antenna to lower-frequency RF signals for demodulation and other processing.

SUMMARY

In some implementations, a receive chain for a satellite gateway includes a block down converter configured to down convert an RF input signal in the Q band to an intermediate frequency (IF) signal in the S band. The down converter can include various features that can provide high performance in converting Q-band signals. For example, the down converter can employ a single mixer stage, which can minimize phase noise and other types of noise. As another example, the down converter can generate a local oscillator signal for the mixer using a series of multiple phase-locked loops (PLLs), to progressively increase the frequency with high accuracy. In addition, the output of the series of PLLs can be further increased using a frequency multiplier, to obtain the final local oscillator signal input to the mixer.

As another example, the down converter can include one or more temperature compensation elements that compensate for changes in gain that are induced by changes in temperature. In some implementations, multiple temperature compensation elements are included at different portions of the signal path through the down converter, enabling the down converter to achieve and maintain desired gain levels. In some implementations, the temperature compensation in the down converter provides temperature stability so that gain does not increase or decrease by more than 1 dB across a temperature range from 20° C. to 40° C.

In some implementations, a radiofrequency down converter includes: an input port to receive a radiofrequency input signal; a first bandpass filter comprising a microwave waveguide, the first bandpass filter being coupled to the input port and being configured to filter the radiofrequency input signal; a mixer stage coupled to the first bandpass filter, the mixer stage being configured to generate a mixer output signal by processing the filtered radiofrequency input signal using a gain adjustment device, one or more amplifiers, and a frequency mixer; a signal adjustment stage coupled to receive the mixer output signal, the signal adjustment stage comprising: a temperature compensation device configured to compensate for changes in signal gain or attenuation due to changes in temperature; a second bandpass filter; a gain adjustment device; one or more amplifiers; and a low pass filter; and an output port coupled to output an adjusted mixer output signal from the signal adjustment stage.

Implementations may include one or more of the following features. For example, in some implementations, the signal adjustment stage further comprises a gain slope compensation device configured to reduce variation in frequency response gain across frequencies in the adjusted mixer output signal.

In some implementations, the temperature compensation device is a first temperature compensation device; the signal adjustment stage further comprises a second temperature compensation device; and the first temperature compensation device is coupled to receive input based on the mixer output signal and provide a first compensated signal to the second bandpass filter, and wherein the gain adjustment device is coupled to receive signals that are based on output of the second bandpass filter, and wherein the second temperature compensation device is coupled to provide output used to provide input to the low pass filter.

In some implementations, the radiofrequency down converter includes a microwave isolator located between the first bandpass filter and the mixer stage, the microwave isolator being configured to propagate microwave signals from the first bandpass filter to the mixer stage and to block propagation of microwave signals from the mixer stage to the first bandpass filter.

In some implementations, the radiofrequency down converter is configured to downconvert an input signal in a band within a range from 36 GHz to 46 GHz to an intermediate frequency signal in a band within a range from 1 GHz to 6 GHz.

In some implementations, the radiofrequency down converter is configured to downconvert input signals from 40 GHz to 42 GHz to an intermediate frequency of 2 GHz to 4 GHz.

In some implementations, the radiofrequency down converter includes: a reference frequency port to receive a reference frequency signal; and a frequency generating stage coupled to receive the reference frequency signal, the frequency generating stage comprising at least one phase-locked loop, the frequency generating stage being configured to provide an output signal that is used to provide a local oscillator signal that is provided to the frequency mixer.

In some implementations, the radiofrequency down converter includes a frequency multiplier device coupled to receive the output signal of the frequency generating stage and to generate the local oscillator signal, wherein the local oscillator signal has a frequency that is greater than the frequency of the output signal of the frequency generating stage by a predetermined multiple.

In some implementations, the frequency generating stage is configured to receive a reference signal at substantially 10 Ghz; the frequency generating stage is configured to output the output signal of the frequency generating stage at substantially 9.5 GHz; and the frequency multiplier device is configured to output the local oscillator signal at substantially 38 GHz.

In some implementations, the frequency generating stage comprises a first phase-locked loop coupled to receive the frequency reference signal, a second phase-locked loop coupled to receive output of the first phase-locked loop, and a third phase-locked loop coupled to receive output of the second phase-locked loop. The first phase-locked loop is a digital phase-locked loop, wherein the second phase-locked loop that is a cleanup phase-locked loop, and wherein the third phase-locked loop configured to provide the output signal for the frequency generating stage at a predetermined frequency.

In some implementations, the radiofrequency down converter includes an oven-controlled crystal oscillator coupled to provide an output signal to the first phase-locked loop.

In some implementations, the temperature compensator device is configured to compensate for changes in signal gain due to changes in temperature caused by the oven-controlled crystal oscillator.

In some implementations, the radiofrequency down converter includes: a monitoring port coupled to provide external output of the output signal provided by the frequency generating stage; and a test port coupled to provide external output of the adjusted mixer output signal.

In another general aspect, a method includes: generating a first oscillator signal at a predetermined frequency using one or more phase-locked loops of a down converter; generating a second oscillator signal that is a multiple of the first oscillator signal using a frequency multiplier of the down converter; receiving a radiofrequency signal at an input of the down converter; filtering the radiofrequency signal using a waveguide roofing filter of the down converter; mixing the filtered radiofrequency signal with the second oscillator signal using a frequency mixer of the down converter; compensating for temperature-induced changes in gain using one or more temperature compensation elements to signals generated of the frequency mixer; filtering output of the frequency mixer using a bandpass filter of the down converter and a low pass filter of the down converter to generate an intermediate frequency signal; and outputting the intermediate frequency signal as an output of the down converter.

Implementations may include one or more of the following features. For example, in some implementations, the method includes receiving input of a reference signal at a first frequency, and generating the first oscillator signal comprises generating the first oscillator signal using a series of multiple phase-locked loops that increase in frequency over multiple stages, the first oscillator signal being generated in alignment with respect to the reference signal.

In some implementations, adjusting gain applied to signals output from the frequency mixer in response to a control signal from one or more processors of the down converter.

In some implementations, the down converter comprises multiple temperature compensation elements placed at different positions in a signal path through the down converter to adjust for temperature-induced variation of signal gain of different components of the down converter.

In some implementations, the down converter is configured to downconvert an input signal in a band within a range from 36 GHz to 46 GHz to an intermediate frequency signal in a band within a range from 1 GHz to 6 GHz.

In some implementations, the down converter is configured to downconvert input signals from 40 GHz to 42 GHz to an intermediate frequency of 2 GHz to 4 GHz.

In some implementations, the down converter is configured to generate the first oscillator signal synchronized with a reference signal at substantially 10 Ghz; wherein the second oscillator signal has a frequency of substantially 9.5 GHz; and wherein the frequency multiplier is configured to output the second oscillator signal at substantially 38 GHz.

Other embodiments of these aspects include corresponding systems, apparatus, and computer programs, configured to perform the actions of the methods, encoded on computer storage devices. A system of one or more computers can be so configured by virtue of software, firmware, hardware, or a combination of them installed on the system that in operation cause the system to perform the actions. One or more computer programs can be so configured by virtue having instructions that, when executed by data processing apparatus, cause the apparatus to perform the actions.

The details of one or more implementations are set forth in the accompanying drawings and the description below. Other potential features and advantages will become apparent from the description, the drawings, and the claims.

BRIEF DESCRIPTION OF THE DRAWINGS

In the drawings, like reference numbers represent corresponding parts throughout.

DETAILED DESCRIPTION

Figure 1:
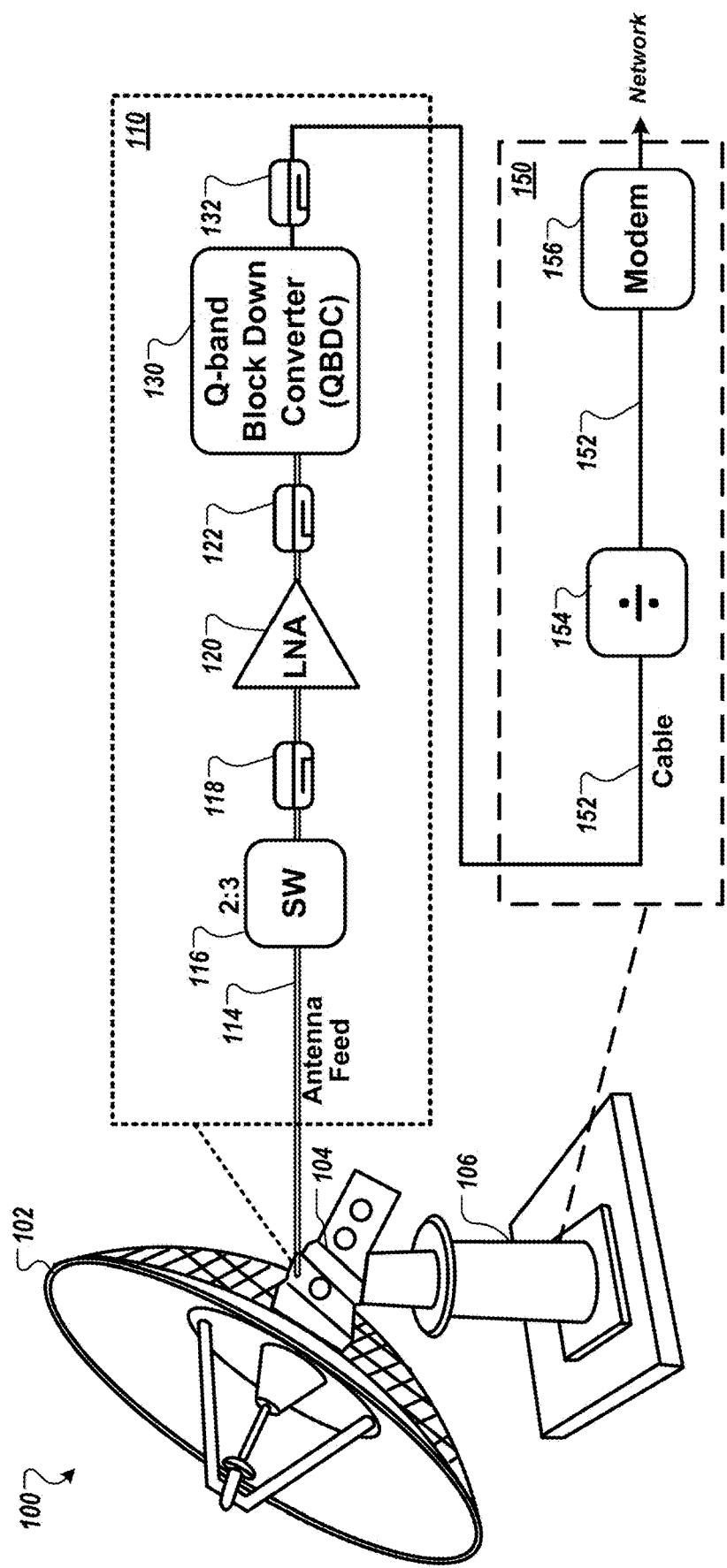
FIG. 1 is a diagram that illustrates an example of an antenna and receive chain for a satellite gateway.

FIG. 1 shows an example antenna 100 of a satellite gateway. The satellite gateway is a ground station that provides the link between a satellite network and a terrestrial network. For example, the satellite gateway uses the antenna 100 to transmits data from a core network (e.g., a wide area network (WAN), the Internet, etc.) to one or more satellites for downlink transmission to terminals (e.g., very small aperture terminals (VSATs)). The satellite gateway also uses the antenna 100 to receive uplink data from terminals via the one or more satellites and provides the uplink data to the core network.

The antenna 100 includes a dish 102, a hub section 104, and a pedestal 106. The antenna 100 can be configured to house various electronics within it. For example, components of a receive chain can be configured to be placed in the antenna 100. The illustrated example shows a series of components that form a receive chain, and which may be designed and sized to be housed within the antenna 100.

The components of the receive chain are illustrated in two different groups. A first group of hub components 110 are located in the hub 104. The hub components 110 include radiofrequency (RF) components including a down converter. A second group of pedestal components 150 is configured to receive and process an intermediate frequency signal and includes components such as a modem.

The antenna 100 can be configured to receive signals in the microwave region of the electromagnetic spectrum, such as signals in the Q band, which used herein refers to the range of 33-50 GHz. While the examples discussed herein focus on the Q band, the techniques used in the antenna 100 and its associated devices like the Q-band block down converter (QBDC) 130 can be applied to receive signals in other bands. The antenna 100 can, of course, be created for and used in more narrow ranges such as the Q band definition of 36-46 GHz set by the International Organization for Standardization (ISO). More generally, the antenna 100 can be designed to operate in the extremely high frequency (EHF) range designation of the International Telecommunication Union (ITU), and in the Ka band (26.5-40 GHz) and/or V band (40-75 GHz) defined by the Institute of Electrical and Electronics Engineers (IEEE).

The QBDC 130 can be configured to down convert input in the Q band to an intermediate frequency in the S band (e.g., 2-4 GHz). However, by changing the local oscillator signals used for mixing and using appropriate filters, the techniques discussed herein can be used to downconvert to other bands such as the L band (e.g., 1-2 GHz), C band (e.g., 4-8 GHz), or other band as appropriate for reception.

Operating a down converter at microwave frequencies, such as the Q-band, can create various challenges for traditional down converter designs. For example, many receiver components and mixer designs create significant amounts of noise, especially phase noise, that can impede proper reception of Q-band signals. This issue often becomes more dominant as the frequency of the signals increases, and can be much more significant for receiving Q-band signals than for K-band signals and lower Ka-band signals. In addition, generating a stable and accurate local oscillator signal for frequency mixing is more challenging for an oscillator signal in the Q-band than for lower-frequency bands.

Effective reception of high frequency RF signals, such as Q-band signals, often requires very accurate, high-performing systems. In many cases, providing amplifiers and the down converter as close to the antenna as possible. Maximizes the quality of reception. For example, providing the low noise amplifier 120 and the QBDC 130 in the hub of the antenna. 100 minimizes signal loss and maximizes the quality of reception. However, receive chain components such as the QBDC are often sensitive to temperature changes, which can affect their performance. As discussed for their below, with respect to FIG. 4, the QBDC 130 can include a number of features to achieve high performance even when exposed to the temperature changes that occur in an outdoor environment or other environment that is not temperature-controlled.

As will be discussed further below, the antenna 100 can be designed to receive signals in the range of 40-42 GHz (e.g., a bandwidth of 2 GHz centered at 41 GHz). To receive the signal, the Q-band block down converter (QBDC) 130 can convert from the RF input frequency range of substantially 40-42 GHz to an intermediate frequency (IF) range of substantially 2-4 GHz. The QBDC 130 can use a single mixer stage to minimize phase noise, and can use a very high-accuracy and high-stability local oscillator signal of substantially 38 GHz. As used herein, a frequency or frequency range boundary at "substantially" a particular frequency can encompass frequencies within 10% of the specified frequency, although the design can be set with values that are closer to the specified frequency (e.g., within 5%, within 1%, within 0.1%, etc.). In addition, many other variations of the frequency plan discussed herein can be used. For example, the QBDC 130 can be designed to receive RF signals with a center frequency that is lower than 41 GHz (e.g., 40 GHz, 38 GHz, 36 GHz, 35 GHz, etc.) or higher than 41 GHz (e.g., 42 GHz, 44 GHz, 46 GHz, 48 GHz, etc.). Similarly, the bandwidth for received RF signals can be greater than 2 GHz (e.g., 2.5 GHz, 3 GHz, 3.5 GHz, 4 GHz, etc.) or less than 2 GHz, (e.g., 1.5 GHz, 1.0 GHz, etc.). The QBDC 130 can also be built to support different IF frequencies, including variation in center frequency and/or bandwidth. For example, rather than a center frequency at 3 GHz and a bandwidth of 2 GHz, the intermediate frequency signals may have a center frequency that is higher (e.g., 3.5 GHz, 4 GHz, etc.) or lower (e.g., 2.5 GHz, 2 GHz, etc.), and the bandwidth may be higher (e.g., 2.5 GHz, 3 GHz, 3.5 GHz, etc.) or lower (e.g., 1.75 GHz, 1.5 GHz, 1 GHz, etc.).

The local oscillator signal can be generated using a multi-stage frequency generator that uses multiple phase-locked loops (PLLs) and a frequency multiplier to generate the local oscillator signal. In addition, the generated frequency can be locked or synchronized to an input frequency reference at a much lower frequency, such as 10 MHz, which can help the system to drive multiple device or units together on a single frequency reference source. For example, multiple QBDC 130 units of a gateway can be synchronized using a common external 10 MHz reference (e.g., using a single source for the reference). In many cases, the modems of a gateway, such as the modem 156, can also use the same common reference as the QBDCs 130. Thus, all components are synchronized so there is no frequency offset.

In further detail, an antenna feed 114 provides the RF signal received using the dish 102. Impedance matching networks or other components can be included, such as a standing wave ratio meter 116. Next, a port 118 or tap is provided to enable monitoring of the signal being received and propagated. The RF signal is propagated to a low noise amplifier 120 that amplifies the signal. After the low noise amplifier 120, another port 122 is provided for monitoring and testing. The amplified signal from the low noise amplifier 120 is propagated further to a block down converter, in this case, a Q-band block down converter (QBDC) 130, which will be discussed in detail below. After the QBDC 130, another port 132 is provided, which can be used to monitor the intermediate frequency (IF) output of the QBDC 130.

The pedestal components 150 receive the IF output from the QBDC 130. A cable 152, such as a coaxial cable, can provide the IF signal to a divider 154, and the divided signal is provided to a modem 156. Output from the modem 156 is provided to a network, such as a core network, a wide area network (WAN), the Internet, or another public network.

Figure 2:
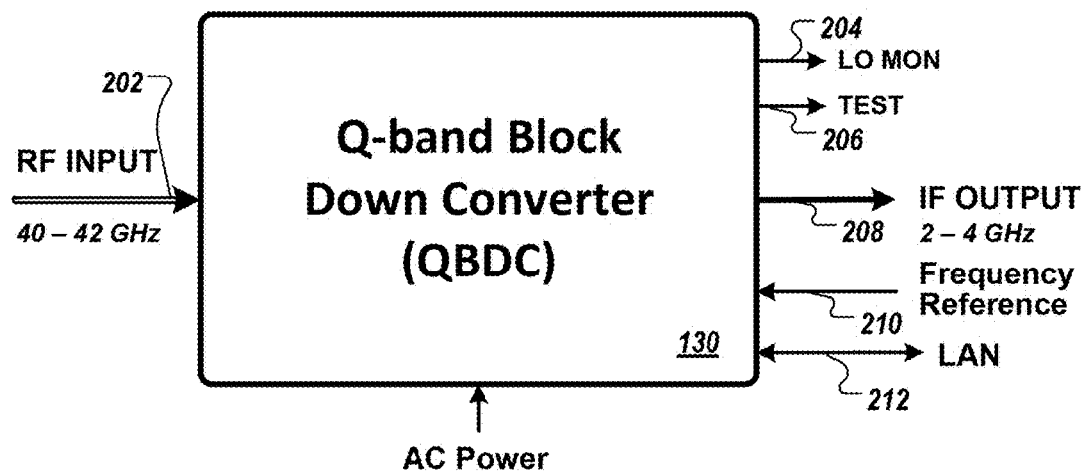
FIG. 2 is a diagram that illustrates an example of a down converter of the receive chain of FIG. 1.

FIG. 2 shows various inputs and outputs of the QBDC 130. The QBDC 130 has an RF input port to receive RF input 202. In the example, the RF input signal to be received is substantially from 40 to 42 GHz. Of course, the QBDC 130 can be designed and used to receive a larger or smaller range of bandwidth, and may be designed and used to receive higher or lower frequencies, including in bands below the Q band. Nevertheless, because the demands on receivers typically increase as the input frequency increases, the QBDC 130 is especially suited for high performance with relatively high RF bands, such as the Q band.

The QBDC 130 has ports for a number of different outputs. These include an intermediate frequency output 208, which in this case is substantially 2-4 GHz. The outputs include a local oscillator monitoring port ("LO MON") that provides a signal related to the local oscillator input to the mixer. In some implementations, the LO MON 204 is not the same frequency provided as input to the mixer, but instead is a fraction of that frequency (e.g., one fourth of the oscillator signal), as discussed with respect to FIG. 4 below. For example, the LO MON 204 signal can be a generated frequency prior to a frequency multiplication stage used to generate the final local oscillator signal input to the mixer. The outputs also include a test output 208 that can be used to test output of the QBDC 130.

The QBDC 130 also receives a frequency reference signal 210, which is used to generate the local oscillator signal used by the mixer. The QBDC 130 also includes a network interface so that bi-directional communication over a local area network (LAN) 212 is provided. This network connection can facilitate monitoring, configuration, status checking, and other operations in combination with a remote system.

Figure 3:
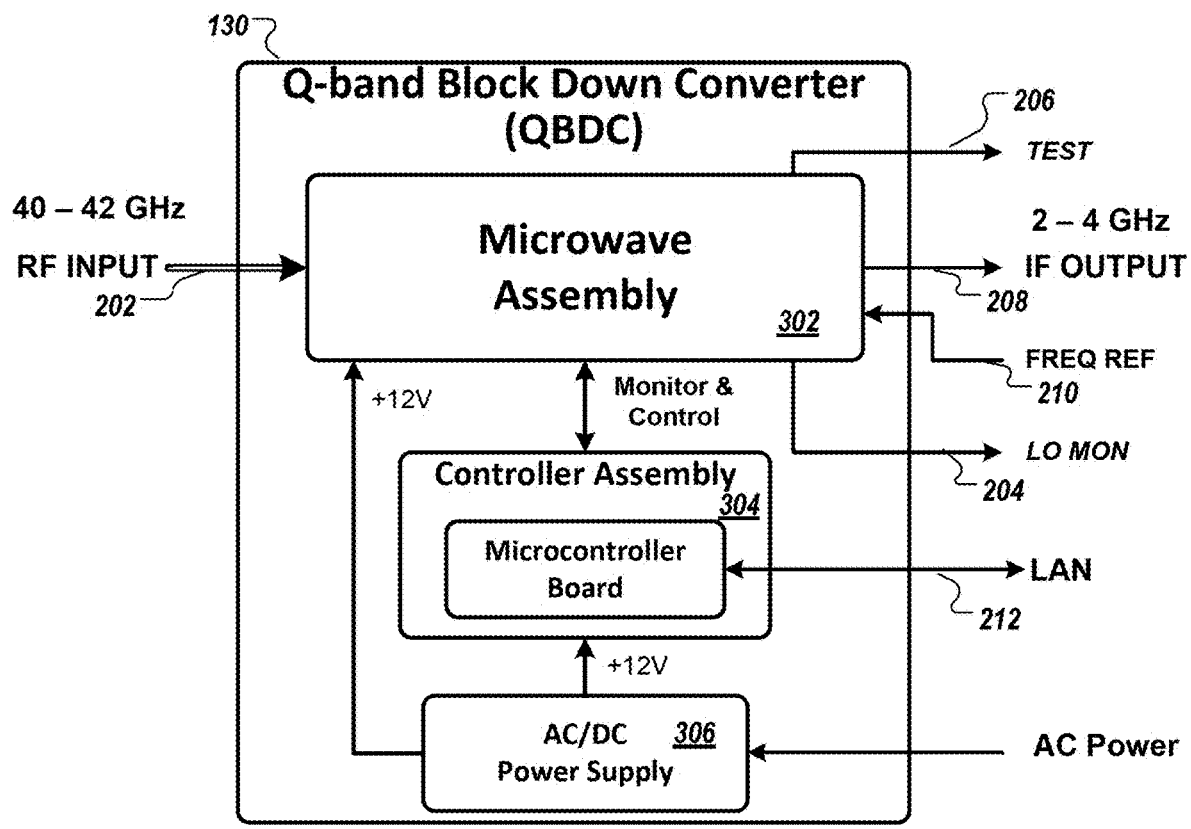
FIG. 3 is a block diagram that illustrates additional features of the down converter.

FIG. 3 is a block diagram of the QBDC 130, showing several of the assemblies within the QBDC 130. For example, the QBDC 130 includes a microwave assembly 302 that receives the RF input 202 and provides the IF output 208. The microwave assembly 302 also receives the frequency reference signal 210 as input, and provides other outputs including the LO MON 204 and test 206 outputs. The QBDC 130 also includes a controller assembly 304, which includes a microcontroller board. The controller assembly 304 monitors the operation of the microwave assembly 302 and performs control functions to configure and adjust operation of the microwave assembly 302 as needed. The controller assembly 304 receives signals over the LAN 212, and can provide status information over the LAN 212 as well as receive instructions and requests to adjust operation of the QBDC 130. The QBDC 130 also includes a power supply 306, which receives alternating current (AC) and provides direct current (DC) output to power the controller assembly 304 and the microwave assembly 302.

As shown in FIG. 3, the RF input 202 can be a signal having a bandwidth of substantially 2 GHz around a center frequency such as a 41 GHz. As a result, the input signal to be received is in the range of substantially 40 to 42 GHz. The microwave assembly 302 of the QBDC 130 down converts from the Q-band RF input 202 to an IF output 208 of substantially 2-4 GHz.

Figure 4:
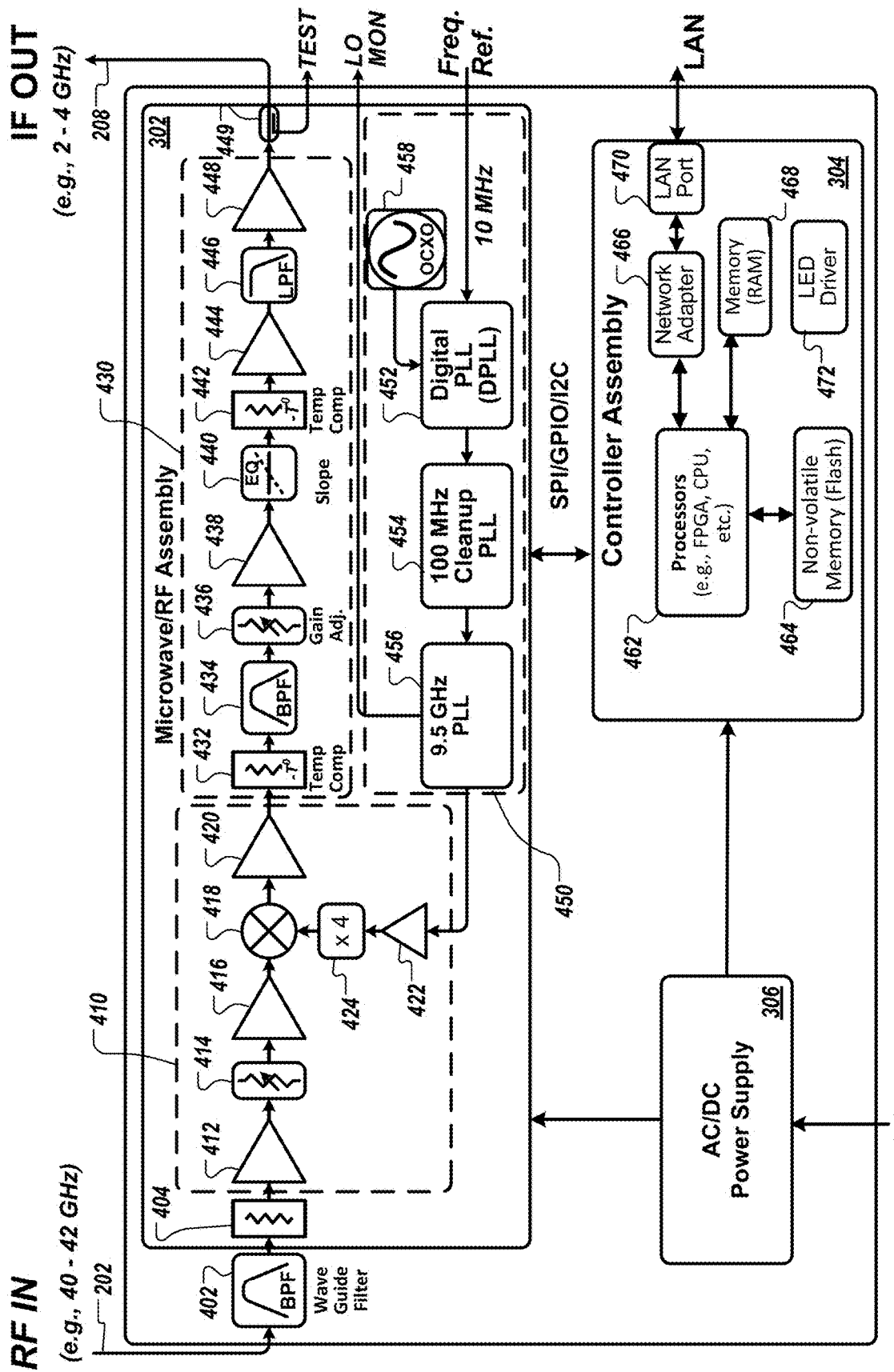
FIG. 4 is a diagram that illustrates additional components of the down converter.

FIG. 4 shows a more detailed diagram of the QBDC 130. For example, the microwave assembly 302 can include sections such as a mixer stage 410, a set of signal adjustment components 430 that receive output of the mixer stage 410, and a frequency generator 450. The QBDC 130 can also include various other signal processing elements as discussed below.

The QBDC 130 is configured to down convert from the Q-band RF input signal 202 to the IF output signal 208. Because Q-band signals are at a much higher frequency than many other frequency bands often used, reception is often impacted much more by any offset or jitter in the local oscillator frequency, by temperature-induced gain variation in amplifiers, and other factors. The QBDC 130 is designed to compensate for many of the effects that would normally reduce the performance of a receiver processing a Q-band signal. Some of the features that enhance reception of Q-band signals include the single mixer stage (as opposed to a multi-stage mixer design), the use of temperature compensation to compensate for temperature-induced change in gain in amplifiers and other components, and a very high-precision system for generating the local oscillator signal for frequency mixing. These and other aspects of the design enable very high performance at Q-band frequencies, to minimize phase noise and other effects that could otherwise impede reception.

As an initial component to receive the RF input 202, the RF receive chain can include an isolator (not shown) at the input where the RF input 202 is received. The isolator can be a waveguide isolator, such as a microwave circulator with a load attached. The isolator can act as a one-way valve for energy to block power being transmitted back toward the antenna. As examples, the isolator can be a ferrite-based isolator, a terminated circulator, a Faraday rotation isolator, a field-displacement isolator, or a resonance absorption isolator.

Next, the RF input 202 is filtered using a band pass filter 402. This bandpass filter 402 can be a roofing filter designed to limit the pass band to the desired signal region, in this case, substantially 40 GHz to 42 GHz. The bandpass filter 402 can be implemented as a waveguide filter, and may include multiple stages, for example, between 9 to 11 stages in some implementations.

After the bandpass filter 402, the filtered signal is provided to an isolator 404, and then passed to the mixer stage 410. The QBDC 130 is can operate with a single mixer stage 410, which includes a single frequency mixer 418. The mixer stage 410 includes an amplifier 412, a gain adjustment device 414, and amplifier 416, the frequency mixer 418, and an amplifier 420.

The mixer stage 410 includes a single frequency mixer element 418 to process the RF input signal. Using only a single mixer 418 in the signal path helps minimize the amount of noise that is added, especially to minimize phase noise. The mixer element 418 receives the output of the amplifier 416 and also receives a local oscillator signal. The local oscillator signal is generated by the frequency generator 450 and a frequency multiplier 424. In particular, the illustrated example has a 9.5 GHz signal output from the frequency generator 450, and the frequency multiplier 424 multiplies this signal by a factor of 4, to obtain a local oscillator signal of 38 GHz. The mixer element 418 thus produces a lower side band at the desired intermediate frequency from 2-4 GHz, e.g., a center at 3 GHz and a bandwidth of 2 GHz.

In many cases, a very stable, highly-accurate oscillator signal is important for accurate downconversion of Q-band signals. To provide a high-quality oscillator signal, the frequency generator 450 includes multiple phase-locked loops (PLLs), and does not attempt to create the 38 GHz signal in a single stage. Instead, the frequency generator 450 uses multiple stages to generate a 9.5 GHz signal with very high accuracy and stability, and the frequency multiplier 424 boosts the frequency to the final oscillator signal desired, e.g., at 38 GHz.

The frequency generator 450 is configured to receive a frequency reference signal 210 at a predetermined frequency, which is substantially 10 GHz in the example. The reference frequency signal 210 is then generated a first PLL, a second PLL 454, and a third PLL 456. The series of PLLs provides a high-quality oscillator signal at the desired level for input to the frequency multiplier 424.

The frequency generator 450 can include an oven-controlled crystal oscillator (OCXO) 458, which may be used in lieu of the external 10 MHz reference. The OCXO has ultra-low phase noise and is extremely stable over temperature. In normal operation, the QBDC's Q-band frequency source is locked to the external 10 MHz reference. Monitor and control circuitry continually checks health and stability of the external 10 MHz reference and the internal OCXO. If the external 10 MHz signal is lost, the monitoring and control circuitry transitions to the internal OCXO with smooth continuation, e.g., a hitless transition that maintains a consistent reference without interruption. When the external 10 MHz reference signal returns, the M&C circuitry switches back to the external reference, again in a hitless transition that maintains the reference signal input at the appropriate frequency to the first PLL 452.

The frequency generator 450 operates the first PLL 452 at 10 MHz, the second PLL 454 at 100 MHz, and the third PLL at 9.5 GHz. As a result, the input frequency reference 210 is increased in frequency by a factor of 10 at the second PLL 454 and the output of that PL is increased in frequency again by a factor of 95 at the third PLL 456. The design of the frequency generator 450 sides a very low noise local oscillator source that is locked to the incoming 10 MHz reference. The frequency generator 450 also provides tolerance to short-term loss of the reference signal 210, to be able to maintain the reference signal even through an interruption or disconnection of the reference for a few seconds.

The first PLL 452 can be a digital PLL. The PLL 452 receives, in addition to the frequency reference signal 210, output of an oven-controlled crystal oscillator (OCXO) 458. The OCXO 458 can include a temperature-controlled chamber used to maintain the crystal of the oscillator at a consistent temperature, to minimize changes in frequency due to changes in ambient temperature.

The output of the first PLL 452 is provided to the second PLL 454, which can be a cleanup PLL providing output at 100 MHz. The output of the second PLL 454 is provided to the third PLL 456, which outputs a 9.5 GHz output signal.

The output of the frequency generator 450 is received by an amplifier 422 in the mixer stage 410. The amplified 9.5 GHz signal is provided to the frequency multiplier 424, which is configured to increase the frequency by an integer multiple. In this case, the frequency multiplier 424 creates the local oscillator signal by multiplying the 9.5 GHz input by a factor of 4.

After frequency mixing occurs at the frequency mixer 418, and that output is amplified by the amplifier 420, the signal adjustment components 430 process the output further. These components 430 perform functions such as signal amplification, gain control (e.g., adjustable gain in a range spanning at 10 dB, 20 dB, 25 dB, or more), intermediate frequency filtering, image frequency, rejection, and rejection of the local oscillator, gain slope correction, and compensation for variation in gain due to temperature changes.

To describe the signal adjustments components 430 further, the amplified mixer output is provided to a first temperature compensation element 432. This element 432 is configured to compensate for the variation in gain that can occur at different temperatures. In many cases, amplifier gain is affected by temperature, and so the temperature compensation element 432 can correct for this effect. The temperature compensation element can be an attenuator circuit chip with a negative temperature coefficient. For example, for many radiofrequency and intermediate-frequency elements, attenuation decreases (or gain increases) as temperature increases. To compensate for this, attenuation circuits that have the opposite property, e.g., attenuation increases as temperature increases, can be provided as temperature compensation elements.

In general, the temperature compensation element 442 can be configured to perform a temperature-dependent amount of power dissipation complementary to the temperature-dependent gain or dissipation of other devices in the QBDC 130, so that the overall gain or attenuation varies minimally with temperature. The temperature compensation element 442 can be implemented using active components or passive components. For example, active compensation can be performed using a temperature sensor to measure a temperature, and transistors and other circuit components to change gain or attenuation based on the measured temperature. As another example, a passive temperature-compensating attenuator can include a network of thermistors to provide a response that varies with temperature, such as a network of thick-film thermistors deposited on an alumina substrate.

Output of the temperature compensation element 432 is provided to a band pass filter 434. The band pass filter 434 can be configured to reject the upper side band (e.g., centered at 79 GHz, extending from 78-80 GHz) as well as the local oscillator frequency (e.g., 38 GHz). Because the local oscillator frequency and the upper side band are so far above the lower side band that provides the desire intermediate frequency, the band pass filter 434 can have a larger passband than the 2-4 GHz range, to ensure that the filter 434 does not attenuate desired IF signals.

After filtering with the band pass filter 434, the filtered signal is provided to a gain adjustment element 436, which allows for a significant amount of gain adjustment. For example, the gain adjustment element 436 can provide adjustable gain, as instructed or controlled using the controller assembly 304. The gain adjustment element 436 can support a range of gain levels, such as a range that spans at least 10 dB, 15 dB, 20 dB, 25 dB, 30 dB or another appropriate level. For example, the gain adjustment element 436 can enable gain to be adjusted over a range from 0-25 dB in steps of 1 dB or less (and in some cases steps of 0.2 dB or less), leading to an overall gain for the QDBC 130 as a whole that is selectable from a range of substantially 5-30 dB. As used here, the term "substantially" can encompass a value that is 10% greater or lower than specified, although the range can be set with greater specificity (e.g., within 5%, within 1%, within 0.1%, etc.).

Output from the gain adjustment element 436 is provided to another amplifier 438, which provides output to a gain slope correction element 440. Because amplifier gain can be different for different frequencies, the gain slope correction element 440 can be configured to apply compensation (e.g., a fixed amount of compensation based on overall characteristics of the receive chain) to equalize gain across the frequencies in the desired IF bandwidth range.

The gain slope correction element 440 can be a circuit that equalizes or flattens the sloping gain across frequencies. In many cases, amplifiers have a gain versus frequency response that exhibits decreasing gain as frequency increases. When multiple amplifiers are cascaded, this can deepen the undesirable slope in the gain versus frequency response. To equalize the gain, the gain slope correction element 440 can use active and/or passive techniques. For example, the gain slope correction element 440 can include an attenuator with a frequency response that slopes downward toward lower frequencies and presents less attenuation at higher frequencies. The attenuation slope can be set to compliment the slope of the amplifiers (e.g., one or more of amplifiers 438, 444, 448, or other amplifiers) and other components, then the overall frequency response of the combined circuits will be relatively flat. As another example, active gain equalizer circuits can be used to provide a gain that increases as frequency increases, to compensate for the overall gain of the that would otherwise decrease as frequency increases.

Output of the gain slope compensation element 440 is provided to a second temperature compensation element 442. Like the first temperature compensation element 432, the second temperature compensation element 442 can adjust signal gain to counteract or compensate for variation in gain due to temperature. The technique of using multiple temperature compensation elements in the receive chain enables fine-tuned control of temperature-based gain compensation. For example, multiple temperature compensation elements provide the ability to more accurately maintain signal gain and signal levels to desired characteristics at multiple points within the receive chain, keeping signal levels at desired levels throughout the receive chain and not simply for the receive chain as a whole. In addition, multiple temperature compensation elements allow compensation to take place at or near the regions where affected amplifiers or other components are located, thus compensating for localized temperatures at different parts of the QBDC 130 itself. For example, the first temperature compensation element 432 can be used to adjust for temperature-induced gain variation in amplifiers 412, 416, and 420, while the temperature compensation element 442 may be located nearer to and may compensate better for temperature-induced gain variation in the amplifiers 438, 444, and 448. The temperature at the different sets of amplifiers may be different, and using separate compensation elements allows different adjustments for the sets of amplifiers having different temperatures.

After the adjustment from the temperature compensation element 442, the signal is amplified with amplifier 444, and the amplified signal is provided to a low pass filter 446. The inclusion of the low pass filter 446, can further reduce or block frequencies above the desired range for IF output 208, such as blocking the upper side band from the mixer element 418 and also the local oscillator signal. In some implementations, due to the band pass filter 434 and the low pass filter 446, the level of rejection of image frequencies and the local oscillator signal at the output of the QBDC 130 is 50 dB or higher. Output of the low pass filter 446 is provided to an amplifier 448 and provided as the IF output 208. A port or tap 449 is provided after the amplifier 448.

The controller assembly 304 includes one or more processors 462, such as a field-programmable gate array (FPGA), a central processing unit, microcontroller, etc. The controller assembly 304 includes non-volatile memory, such as NAND Flash memory, to store FPGA bitstreams, software to be executed, configuration data, and so on. The controller assembly 304 also includes system memory, e.g., random access memory (RAM), that the processors 462 can use. The controller assembly 304 includes a network adapter 466 and a LAN port 470 that enable the processors 462 to communicate with a network management system. For example, the processors 462 can provide status information over the network, as well as receive instructions, software, and configuration settings over the network. The processors 462 can be configured to monitor and adjust operation of the microwave assembly 302, for example, to monitoring and adjust the level of gain applied, to monitor operation and status of different components, and so on. The processors 462 can communicate with the microwave assembly using a digital bus or other interface, such as a serial peripheral interface (SPI), general purpose input/output (GPIO), Inter-Integrated Circuit (I2C) bus, etc.

Using the architecture illustrated in FIG. 4, the QBDC 130 can be configured to provide the performance characteristics shown in the table below. These characteristics are provided as an example, but the techniques can be used advantageously for other configurations, such as other input frequency ranges, other output frequency ranges, different gain ranges, and so on.

| Performance Parameter | Characteristics | Notes |
|---|---|---|
| RF Input Frequency Range | 40.00-42.01 GHz | |
| IF Output Frequency Range | 2.00-4.01 GHz | |
| Gain Range | 5-30 dB in 0.2 dB steps | |
| Noise Figure | ≤15 dB | At 30 dB gain |
| Gain Flatness | <1.0 dB peak-to-peak | across any 200 MHz band |
| | <2.5 dB peak-to-peak | Full 2.0 GHz band |
| Group Delay | ≤4 ns peak-to-peak | In any 25 MHz BW |
| Gain Stability (Time) | ≤0.5 dB in 24 Hours | At constant temperature |
| Gain Stability (Temperature) | <=+0.75 dB | 20° C. to 40° C. |
| Input IP3 | ≥−5 dBm | |
| Spurious | ≤−50 dBc | |
| Phase Noise (DSB) | ≤1.0 deg RMS | integrated from 500 Hz to 20 MHz |
| Image Rejection | ≥50 dB | In some implementations, image rejection can be 60 dB or greater |
| Input Voltage Standing Wave Ratio (VSWR) | 1.5:1 or less | Zo = 50 ohm, (WR-22) |
| Output Voltage Standing Wave Ratio (VSWR) | 1.5:1 or less | Zo = 50 ohm, (N-f) |

Figure 5:
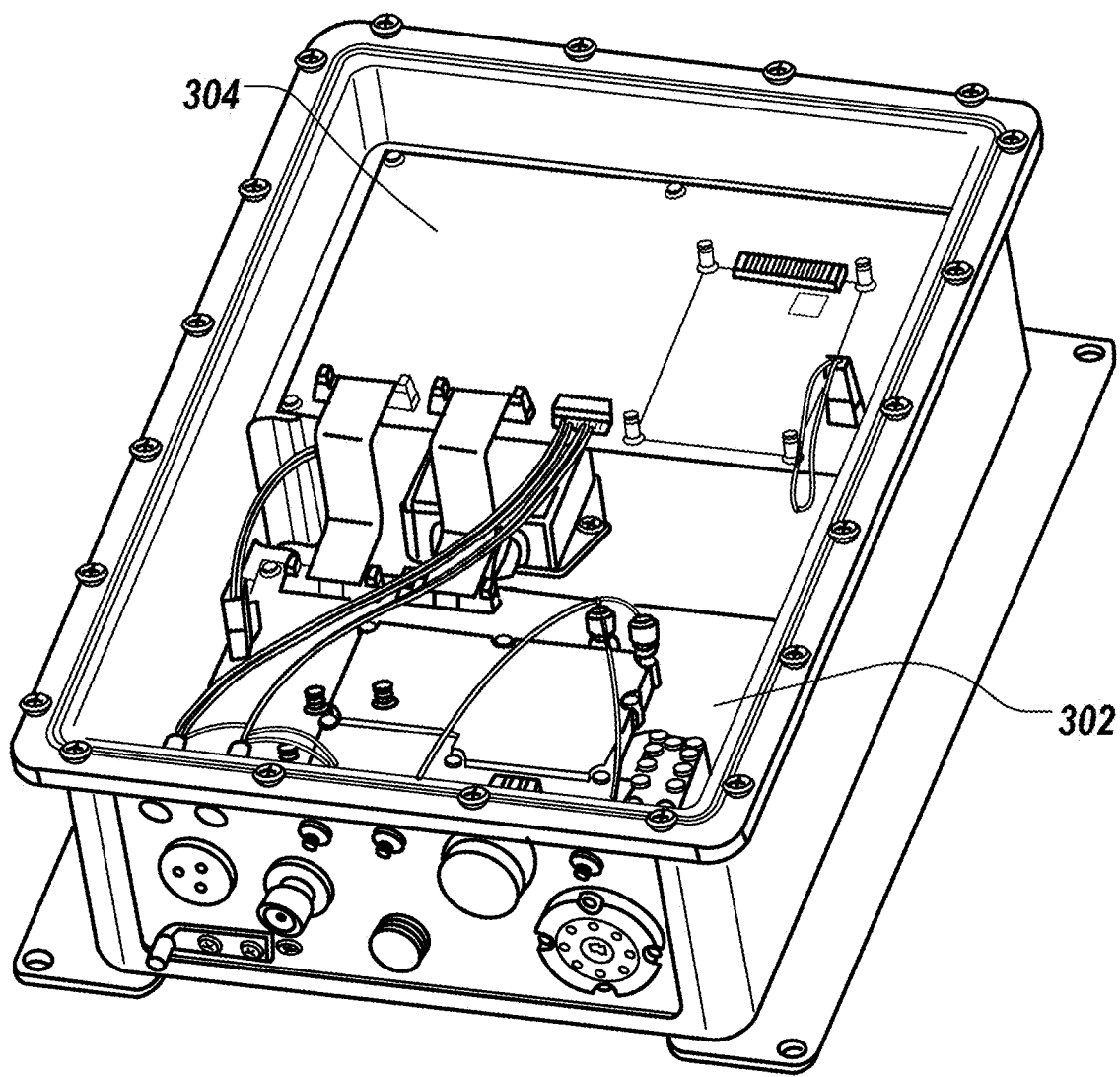
FIG. 5 is a perspective cutaway view of the down converter.

FIG. 5 shows an example of the controller assembly 304 and the microwave assembly 302 in a housing 500. The housing is configured to be removable from the antenna 100 and also to be mountable to the antenna 100.

Figure 6:
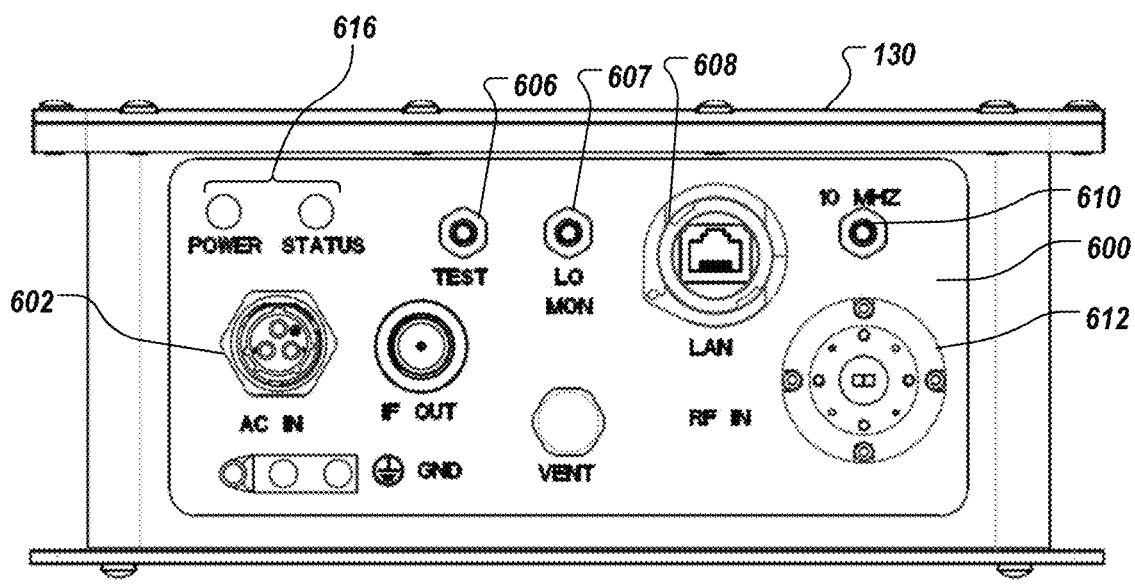
FIG. 6 is a front view that illustrates a panel of the down converter.

FIG. 6 shows a view of the ports at the exterior of the QBDC 130. The housing 500 can include a panel 600 that provides access to the various ports and indicator lights of the QBDC 130. For example, the panel 600 includes an AC input port 602, an output port 604 for output of the IF output 208, a test output port 606, a local oscillator monitoring (LO MON) port 607, a LAN port 608 (e.g., the LAN port 470 of FIG. 4), a reference frequency input port 610, and an RF input port 612. The panel 600 also includes a vent 614 and indicator lights 616 to indicate power on status and operating status.

A number of embodiments have been described. Nevertheless, it will be understood that various modifications can be made without departing from the spirit and scope of the invention. In addition, the logic flows depicted in the figures do not require the particular order shown, or sequential order, to achieve desirable results. In addition, other steps can be provided, or steps can be eliminated, from the described flows, and other components can be added to, or removed from, the described systems. Accordingly, other embodiments are within the scope of the following claims.

A number of implementations have been described. Nevertheless, it will be understood that various modifications may be made without departing from the spirit and scope of the disclosure. For example, various forms of the flows shown above may be used, with steps re-ordered, added, or removed.

Embodiments of the invention and all of the functional operations described in this specification can be implemented in digital electronic circuitry, or in computer software, firmware, or hardware, including the structures disclosed in this specification and their structural equivalents, or in combinations of one or more of them. Embodiments of the invention can be implemented as one or more computer program products, e.g., one or more modules of computer program instructions encoded on a computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. A propagated signal is an artificially generated signal, e.g., a machine-generated electrical, optical, or electromagnetic signal that is generated to encode information for transmission to suitable receiver apparatus.

A computer program (also known as a program, software, software application, script, or code) can be written in any form of programming language, including compiled or interpreted languages, and it can be deployed in any form, including as a stand alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a tablet computer, a mobile telephone, a personal digital assistant (PDA), a mobile audio player, a Global Positioning System (GPS) receiver, to name just a few. Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, embodiments of the invention can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Embodiments of the invention can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the invention, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other.

While this specification contains many specifics, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

In each instance where an HTML file is mentioned, other file types or formats may be substituted. For instance, an HTML file may be replaced by an XML, JSON, plain text, or other types of files. Moreover, where a table or hash table is mentioned, other data structures (such as spreadsheets, relational databases, or structured files) may be used.

Particular embodiments of the invention have been described. Other embodiments are within the scope of the following claims. For example, the steps recited in the claims can be performed in a different order and still achieve desirable results.

What is claimed is:

1. A radiofrequency down converter, comprising:
an input port to receive a radiofrequency input signal;
a first bandpass filter comprising a microwave waveguide, the first bandpass filter being coupled to the input port and being configured to filter the radiofrequency input signal;
a frequency generator and a frequency multiplier that are used to generate an oscillator signal, wherein the frequency generator comprises at least one phase-locked loop and is configured to output a first signal having a first frequency, and wherein the frequency multiplier is configured to receive the first signal and output a second signal that has a second frequency that is a multiple of the first frequency;
a mixer stage coupled to the first bandpass filter, the mixer stage being configured to generate a mixer output signal by processing the filtered radiofrequency input signal using a frequency mixer that receives the oscillator signal;
a signal adjustment stage coupled to receive the mixer output signal, the signal adjustment stage comprising a second bandpass filter; and
an output port coupled to output an adjusted mixer output signal from the signal adjustment stage.

2. The radiofrequency down converter of claim 1, wherein the signal adjustment stage further comprises a gain slope compensation device configured to reduce variation in frequency response gain across frequencies in the adjusted mixer output signal.

3. The radiofrequency down converter of claim 1, wherein the radiofrequency down converter further comprises a temperature compensation device configured to compensate for changes in signal gain or attenuation due to changes in temperature.

4. The radiofrequency down converter of claim 1, further comprising a microwave isolator located between the first bandpass filter and the mixer stage, the microwave isolator being configured to propagate microwave signals from the first bandpass filter to the mixer stage and to block propagation of microwave signals from the mixer stage to the first bandpass filter.

5. The radiofrequency down converter of claim 1, wherein the radiofrequency down converter is configured to down-convert an input signal in a band within a range from 36 GHz to 46 GHz to an intermediate frequency signal in a band within a range from 1 GHz to 6 GHz.

6. The radiofrequency down converter of claim 1, wherein the radiofrequency down converter is configured to down-convert input signals from 40 GHz to 42 GHz to an intermediate frequency of 2 GHz to 4 GHz.

7. The radiofrequency down converter of claim 1, wherein the frequency generator is a frequency generating stage that comprises a first phase-locked loop coupled to receive a frequency reference signal, a second phase-locked loop coupled to receive output of the first phase-locked loop, and a third phase-locked loop coupled to receive output of the second phase-locked loop; and
wherein the first phase-locked loop is a digital phase-locked loop, wherein the second phase-locked loop that is a cleanup phase-locked loop, and wherein the third phase-locked loop configured to provide an output signal for the frequency generating stage at a predetermined frequency.

8. The radiofrequency down converter of claim 1, further comprising an oven-controlled crystal oscillator coupled to provide an output signal to the at least one phase-locked loop.

9. The radiofrequency down converter of claim 8, wherein the radiofrequency down converter comprises a temperature compensation device configured to compensate for changes in signal gain due to changes in temperature caused by the oven-controlled crystal oscillator.

10. A radiofrequency down converter, comprising:
an input port to receive a radiofrequency input signal;
a first bandpass filter comprising a microwave waveguide, the first bandpass filter being coupled to the input port and being configured to filter the radiofrequency input signal;
a mixer stage coupled to the first bandpass filter, the mixer stage being configured to generate a mixer output signal by processing the filtered radiofrequency input signal using a frequency mixer that receives an oscillator signal;
a signal adjustment stage coupled to receive the mixer output signal and to provide an intermediate frequency output signal, the signal adjustment stage comprising a second bandpass filter; and
an output port coupled to output an adjusted mixer output signal from the signal adjustment stage, wherein the radiofrequency down converter is configured to down-convert input signals in a band within a range from 36 GHz to 46 GHz to output signals in a band within a range from 1 GHz to 6 GHz.

11. The radiofrequency down converter of claim 10, wherein the signal adjustment stage further comprises a gain slope compensation device configured to reduce variation in frequency response gain across frequencies in the adjusted mixer output signal.

12. The radiofrequency down converter of claim 10, wherein the radiofrequency down converter further comprises a temperature compensation device configured to compensate for changes in signal gain or attenuation due to changes in temperature.

13. The radiofrequency down converter of claim 1, further comprising a microwave isolator located between the first bandpass filter and the mixer stage, the microwave isolator being configured to propagate microwave signals from the first bandpass filter to the mixer stage and to block propagation of microwave signals from the mixer stage to the first bandpass filter.

14. A method comprising:
generating a first oscillator signal at a predetermined frequency using one or more phase-locked loops of a down converter;
generating a second oscillator signal that is a multiple of the first oscillator signal using a frequency multiplier of the down converter;
receiving a radiofrequency signal at an input of the down converter;
filtering the radiofrequency signal using a first bandpass filter of the down converter, the first bandpass filter comprising a microwave waveguide;
mixing the filtered radiofrequency signal with the second oscillator signal using a frequency mixer of the down converter;
filtering output of the frequency mixer using a second bandpass filter of the down converter; and outputting, as an output of the down converter, an intermediate frequency signal based on output of the second bandpass filter.

15. The method of claim 14, further comprising receiving input of a reference signal at a first frequency;
wherein generating the first oscillator signal comprises generating the first oscillator signal using a series of multiple phase-locked loops that increase in frequency over multiple stages, the first oscillator signal being generated in alignment with respect to the reference signal.

16. The method of claim 14, comprising adjusting gain applied to signals output from the frequency mixer in response to a control signal from one or more processors of the down converter.

17. The method of claim 14, wherein the down converter comprises multiple temperature compensation elements placed at different positions in a signal path through the down converter to adjust for temperature-induced variation of signal gain of different components of the down converter.

18. The method of claim 14, wherein the down converter is configured to downconvert an input signal in a band within a range from 36 GHz to 46 GHz to an intermediate frequency signal in a band within a range from 1 GHz to 6 GHz.

19. The method of claim 14, wherein the down converter is configured to downconvert input signals from 40 GHz to 42 GHz to an intermediate frequency of 2 GHz to 4 GHz.

20. The method of claim 14, wherein the down converter is configured to generate the first oscillator signal synchronized with a reference signal at substantially 10 Ghz;
wherein the second oscillator signal has a frequency of substantially 9.5 GHz; and
wherein the frequency multiplier is configured to output the second oscillator signal at substantially 38 GHz.

* * * * *